(12) United States Patent
Dix

(10) Patent No.: US 7,675,134 B2
(45) Date of Patent: Mar. 9, 2010

(54) TEMPERATURE COMPENSATED WORK FUNCTION BASED VOLTAGE REFERENCE

(75) Inventor: Gregory Dix, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 159 days.

(21) Appl. No.: 12/098,689

(22) Filed: Apr. 7, 2008

(65) Prior Publication Data

US 2009/0251204 A1  Oct. 8, 2009

(51) Int. Cl.
*H01L 31/058* (2006.01)
(52) U.S. Cl. .................. 257/469; 257/467; 438/48
(58) Field of Classification Search .......... 257/467, 257/469; 438/48
See application file for complete search history.

(56) References Cited

U.S. PATENT DOCUMENTS

| 6,255,874 B1 * | 7/2001 | Shay | 327/170 |
| 7,504,874 B2 * | 3/2009 | Oehm | 327/513 |
| 2004/0207380 A1 * | 10/2004 | Ariki | 323/313 |

OTHER PUBLICATIONS

MOS Voltage Reference Based on Polysilicon Gate Work Function Difference; Henri J. Oguey, Member, IEEE, and Bernard Gerber; IEEE Journal of Solid-State Circuits, vol. SC-15, No. 3, Jun. 1980; pp. 264-269, 1980.
A New NMOS Temperature-Stable Voltage Reference; Robert A. Blauschild, Member, IEEE, Patrick A. Tucci, Member, IEEE, Richard S. Muller, Senior Member, IEEE, and Robert G. Meyer, Senior Member, IEEE; IEEE Journal of Solid-State Circuits, vol. SC-13, No. 6, Dec. 1978; pp. 767-774, 1978.

* cited by examiner

*Primary Examiner*—Douglas M Menz
(74) *Attorney, Agent, or Firm*—King & Spalding L.L.P.

(57) ABSTRACT

A temperature compensated voltage reference is created from an operational amplifier circuit having two substantially identical P-channel metal oxide semiconductor (P-MOS) transistors with each one having a different gate dopant. The different gate dopants result in different threshold voltages for each of the two otherwise substantially identical P-MOS transistors. The difference between these two threshold voltages is then used to create the voltage reference equal to the difference. The two P-MOS transistors are configured as a differential pair in the operational amplifier circuit and the output of the operational amplifier is used as the voltage reference. The transistor widths of two P-MOS transistors are adjusted to minimize voltage variation over a temperature range.

23 Claims, 5 Drawing Sheets

US 7,675,134 B2

TEMPERATURE COMPENSATED WORK FUNCTION BASED VOLTAGE REFERENCE

RELATED PATENT APPLICATION

This patent application is related to commonly owned U.S. patent application Ser. No. 12/098,660, filed Apr. 7, 2008, entitled "Work Function Based Voltage Reference" by Gregory Dix, and is hereby incorporated by reference herein for all purposes.

TECHNICAL FIELD

The present disclosure relates generally to voltage references, and more particularly, to a voltage reference based upon the work function difference between two P-channel metal oxide semiconductor (P-MOS) transistors having differently doped gates and configured as a differential pair in an operational amplifier. Temperature compensation of this voltage reference may be achieved by selecting appropriate gains during the design of the P-MOS transistors and/or their N-channel metal oxide semiconductor (N-MOS) load transistors that make up the operational amplifier circuit voltage reference.

BACKGROUND

Voltage references, such as bandgap voltage references, are widely used in various analog and digital integrated circuit functions, e.g., analog-to-digital and digital-to-analog conversion. The operation of a bandgap voltage reference relies upon the voltage difference between two diodes, often operated at the same current and having different junction areas, that is used to generate a proportional to absolute temperature (PTAT) current in a first resistor. This current is used to generate a voltage in a second resistor. This voltage in turn is added to the voltage of one of the diodes (or a third one, in some implementations). If the ratio between the first and second resistors is chosen properly, the first order effects of the temperature dependency of the diodes and the PTAT current will cancel out. The resulting voltage is about 1.2-1.3 volts, depending on the particular technology used, and is close to the theoretical bandgap of silicon at 0 K.

However, the diodes used in the bandgap voltage reference generate noise that is introduced into circuits coupled to the bandgap reference (voltage+noise). The diodes and support circuits used in the bandgap voltage reference require a lot of integrated circuit die real estate and consume a fair amount of power during operation thereof. Initial output voltage distribution from the bandgap voltage reference during startup is not stable until a certain time passes. The voltage from the bandgap reference also varies with temperature.

SUMMARY

What is needed is a better way to generate a low noise, low-temperature drift, stable upon startup voltage reference that uses less integrated circuit die real estate and consumes less power during operation thereof.

According to the teachings of this disclosure, a voltage reference is created from an operational amplifier circuit that comprises two substantially identical P-channel metal oxide semiconductor (P-MOS) transistors, each of the P-MOS transistors having a different gate dopant. The different gate dopants cause different threshold voltages for each of the two otherwise substantially identical P-MOS transistors. The difference between these two threshold voltages is then used to create a voltage reference equal to the difference between the two threshold voltages.

The two P-MOS transistors are configured as a differential pair in an operational amplifier circuit. The two P-MOS transistors, each having a different gate dopant, are substantially identical otherwise, except as noted below, so that temperature dependence of the threshold voltage is minimal and may be compensated for by changing the gain(s) of the associated P-MOS transistor(s). By implementing the two P-MOS transistors having the different gate dopants into an operational amplifier type of circuit, the total variation of the output reference voltage is minimized. Since P-MOS transistors are less susceptible to substrate noise than are diodes, noise generation/immunity is much better when using the P-MOS transistors then with a standard diode based voltage reference, e.g., bandgap voltage reference. Positive feedback in the operational amplifier circuit allows for quick startup and good stability. The simplicity of the operational amplifier circuit requires only a small area for fabrication on the integrated circuit die.

Temperature compensation of the voltage reference may be achieved by selecting during design appropriate gains for each of the P-MOS and/or N-MOS transistors. The gain, $\beta$, of a MOS transistor may be determined by the channel width, W, divided by the length, L, between the source and drain regions (see FIG. 5), i.e., $\beta = W/L$. Generally, the width, W, is adjusted for a specific gain, $\beta$, and the length, L, stays the same. However, it is contemplated and within the scope of this disclosure that the length, L, of a MOS transistor structure may also be varied for changing the gains of the P-MOS and/or N-MOS transistors.

For example, making the p-type gate P-MOS transistor have a higher gain than the n-type P-MOS transistor, e.g., about a four-to-one ratio, and the N-MOS transistor load for the n-type P-MOS transistor have a higher gain than the N-MOS transistor load for the p-type P-MOS transistor, e.g., about a seven-to-one ratio, temperature compensation of the output of the operational amplifier may be less than about 50 parts per million (ppm). By doing this temperature compensation directly in the operational amplifier circuit, complexity of the voltage regulator circuit is reduced and distribution of the output voltage (reference voltage) is improved.

According to a specific example embodiment of this disclosure, a temperature compensated voltage reference fabricated on an integrated circuit die comprises: a first P-channel metal oxide semiconductor (P-MOS) transistor having an N-type polysilicon gate, wherein the N-type polysilicon gate causes the first P-MOS transistor to have a first threshold voltage; the first P-MOS transistor having a first width; a second P-MOS transistor having a P-type polysilicon gate, wherein the P-type polysilicon gate causes the second P-MOS transistor to have a second threshold voltage; the second P-MOS transistor having a second width, wherein the first and second widths are selected for optimal temperature compensation; the first and second P-MOS transistors are configured as a differential pair of an operational amplifier; and the operational amplifier has an output voltage substantially equal to a difference between the first and the second threshold voltages, wherein the first and second widths of the first and second P-MOS transistors are selected to compensate for a variation in the output voltage over a temperature range.

According to another specific example embodiment of this disclosure, a method of fabricating a temperature compensated voltage reference on an integrated circuit die comprises the steps of: providing an N-type well/region in a silicon semiconductor integrated circuit die; creating a first transistor having a first width in the silicon semiconductor integrated circuit die for a first P-channel metal oxide semiconductor (P-MOS) transistor; creating a second transistor having a second width in the silicon semiconductor integrated circuit die for a second P-MOS transistor; covering at least a portion of the N-type substrate with an oxide layer in an area used to form first and second gates of the first and second P-MOS transistors, respectively, for an operational amplifier; covering the oxide layer with a polysilicon layer; implanting a $P^-$ dopant into the polysilicon layer; covering a portion of the $P^-$ doped polysilicon layer with a first resist mask over where the second P-MOS transistor is located; implanting an $N^+$ dopant into the $P^-$ doped polysilicon layer wherever the first resist mask does not cover the $P^-$ doped polysilicon layer; removing the first resist mask; covering a portion of the $N^+$ doped polysilicon layer and a portion of the $P^-$ doped polysilicon layer with a second resist mask; and removing the $N^+$ doped polysilicon layer where not covered by the second resist mask to form an N-type polysilicon gate for the first P-MOS transistor, the $P^-$ doped polysilicon layer where not covered by the second resist mask to form a P-type polysilicon gate for the second P-MOS transistor, and the oxide layer where not covered by the second resist mask, wherein the first and second P-MOS transistors have different threshold voltages, and the first and second widths of the first and second P-MOS transistors are selected to compensate for threshold voltage variations of the first and second P-MOS transistors over a temperature range.

BRIEF DESCRIPTION OF THE DRAWINGS

A more complete understanding of the present disclosure thereof may be acquired by referring to the following description taken in conjunction with the accompanying drawings wherein.

Figure 1:
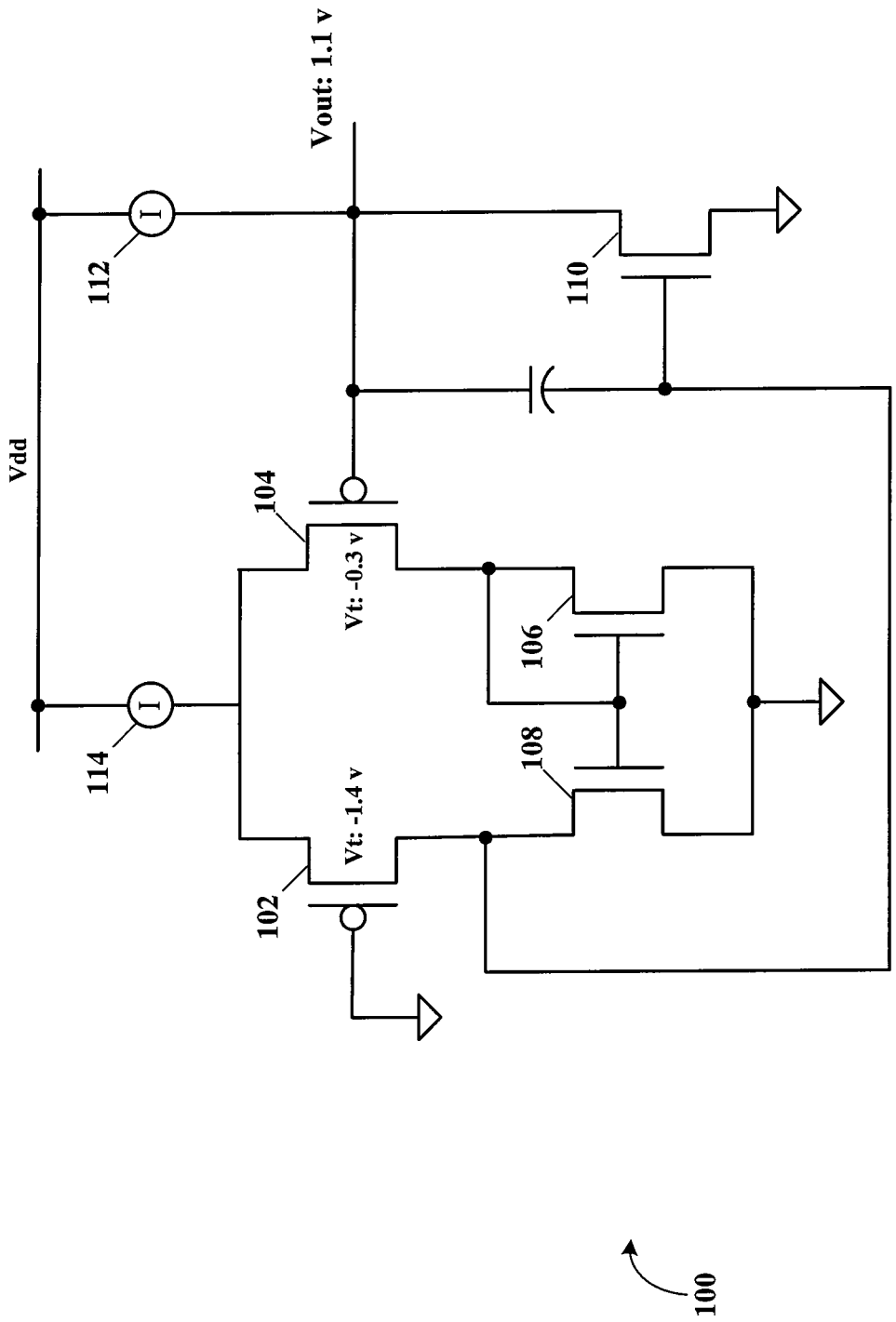
FIG. 1 is a schematic circuit diagram of an operational amplifier utilizing two substantially identical P-channel metal oxide semiconductor (P-MOS) transistors arranged in a differential pair with each one having a different gate dopant, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic circuit diagram of an operational amplifier utilizing two substantially identical P-channel metal oxide semiconductor (P-MOS) transistors arranged in a differential pair with each one having a different gate dopant, according to specific example embodiments of this disclosure. An operational amplifier circuit, generally represented by the numeral 100, comprises P-MOS transistors 102 and 104 configured as a differential pair, N-MOS transistors 106 and 108, constant current sources 112 and 114, and an output transistor 110. The N-MOS transistors 108 and 106 are used as loads for the P-MOS transistors 102 and 104, respectively. Since the N-MOS transistors 106 and 108 are configured as a current mirror circuit, each of the P-MOS transistors 102 and 104 operate at substantially the same current.

The P-MOS transistors 102 and 104 each have a different gate dopant so as to produce a different threshold voltage, Vt, for each of the respective P-MOS transistors 102 and 104. For the P-MOS transistor 102 the threshold voltage is about −1.4 volts and for the P-MOS transistor 104 the threshold voltage is about −0.3 volts. Otherwise, the P-MOS transistors 102 and 104 are substantially identical so that temperature dependence of the threshold voltage is minimal and may be compensated for by changing the gain(s) of the associated P-MOS transistor(s) 102 and/or 104. By implementing the P-MOS transistors 102 and 104 with the different threshold voltages into an operational amplifier type of circuit 100, the voltage at the output of the operational amplifier circuit 100 is the difference of the aforementioned threshold voltages, i.e., Vout=1.1 volt. The variation of the output reference voltage is minimized since the structures of the P-MOS transistors 102 and 104 are substantially identical otherwise. Since the P-MOS transistors 102 and 104 are less susceptible to substrate noise than are diodes, noise generation/immunity is much better when using the P-MOS transistors 102 and 104 then with a standard diode based voltage reference, e.g., a bandgap voltage reference. Therefore the output, Vout=1.1 volt, of the operational amplifier circuit 100 may be used as a very stable and low noise voltage reference.

Figure 2:
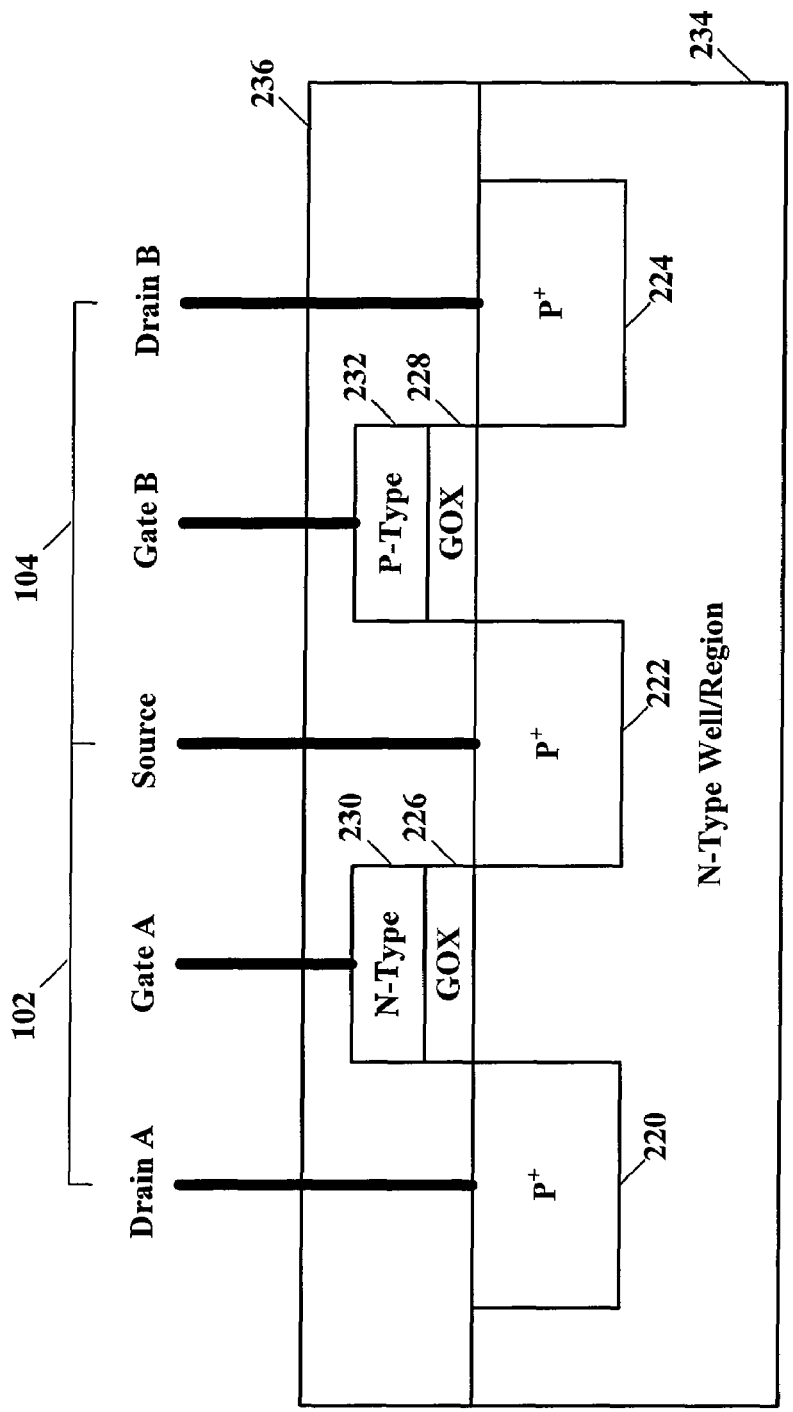
FIG. 2 is a schematic diagram of a cross sectional elevation of a pair of P-MOS transistors as shown in FIG. 1 and having a common source well, according a specific example embodiment of this disclosure.

Referring to FIG. 2, depicted is a schematic diagram of a cross sectional elevation of a pair of P-MOS transistors as shown in FIG. 1 and having a common source well, according a specific example embodiment of this disclosure. The P-MOS transistor 102 comprises a $P^+$ well drain 220, a gate oxide 226, an N-type polysilicon gate 230 and a $P^+$ well source 222. The P-MOS transistor 104 comprises a $P^+$ well drain 224, a gate oxide 228, a P-type polysilicon gate 232 and the $P^+$ well source 222. The $P^+$ well source 222 is common for the pair of P-MOS transistors 102 and 104. The source and drain $P^+$ wells 220, 222 and 224 are in an N-type well/region 234. The aforementioned elements of the P-MOS transistors 102 and 104 may be covered with a protective oxide layer 236. The source, gate and drain connections are schematically represented by heavy black lines.

Figure 3:
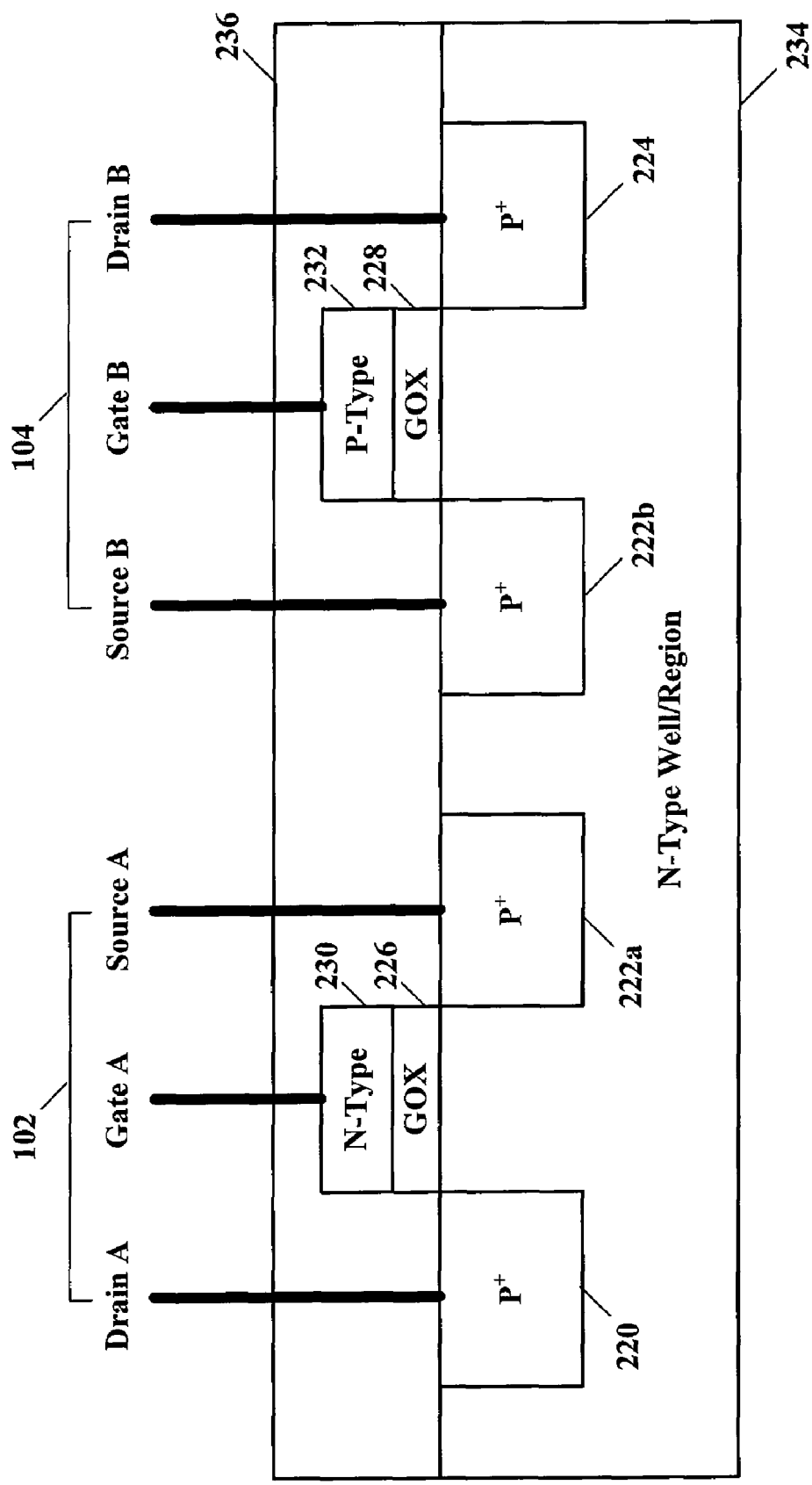
FIG. 3 is a schematic diagram of a cross sectional elevation of a pair of P-MOS transistors as shown in FIG. 1 and having individual source wells, according another specific example embodiment of this disclosure.

Referring to FIG. 3, depicted is a schematic diagram of a cross sectional elevation of a pair of P-MOS transistors as shown in FIG. 1 and having individual source wells, according another specific example embodiment of this disclosure. The P-MOS transistor 102 comprises a $P^+$ well drain 220, a gate oxide 226, an N-type polysilicon gate 230 and a $P^+$ well source 222a. The P-MOS transistor 104 comprises a P+ well drain 224, a gate oxide 228, a P-type polysilicon gate 232 and a P+ well source 222b. The P+ well sources 222a and 222b are separate for the pair of P-MOS transistors 102 and 104, but otherwise function substantially the same as the pair P-MOS transistors shown in FIG. 2. The drain and source P+ wells 220, 222a, 222b and 224 are in an N-type well/region 234. The aforementioned elements of the pair of P-MOS transistors 102 and 104 may be covered with a protective oxide layer 236. The source, gate and drain connections are schematically represented by heavy black lines.

The N-type polysilicon gate 230 configuration gives the P-MOS transistor 102 a threshold voltage, Vt, of about −1.4 volts. The P-type polysilicon gate 232 configuration gives the P-MOS transistor 104 a threshold voltage, Vt, of about −0.3 volts. The difference between the threshold voltage (−1.4 volts) of the P-MOS transistor 102 and the threshold voltage (−0.3 volts) of the P-MOS transistor 104 is approximately equal to the difference in the work function of the gate electrodes. Adding an additional light P-type implant, e.g., boron, into the channels of both P-MOS transistors 102 and 104 can reduce threshold voltages, e.g., approximately −1.1 volts and approximately 0.0 volts, respectively. Having this small a threshold voltage may push the P-MOS transistor 104 into a depletion type mode of operation and can create increased operational headroom for lower voltage operation of the voltage reference operational amplifier circuit, according to the teachings of this disclosure. Fabrication of the N-type polysilicon gate 230 and the P-type polysilicon gate 232 are discussed more fully in the description relating to FIGS. 4(a)-(d) hereinbelow.

Figure 4:
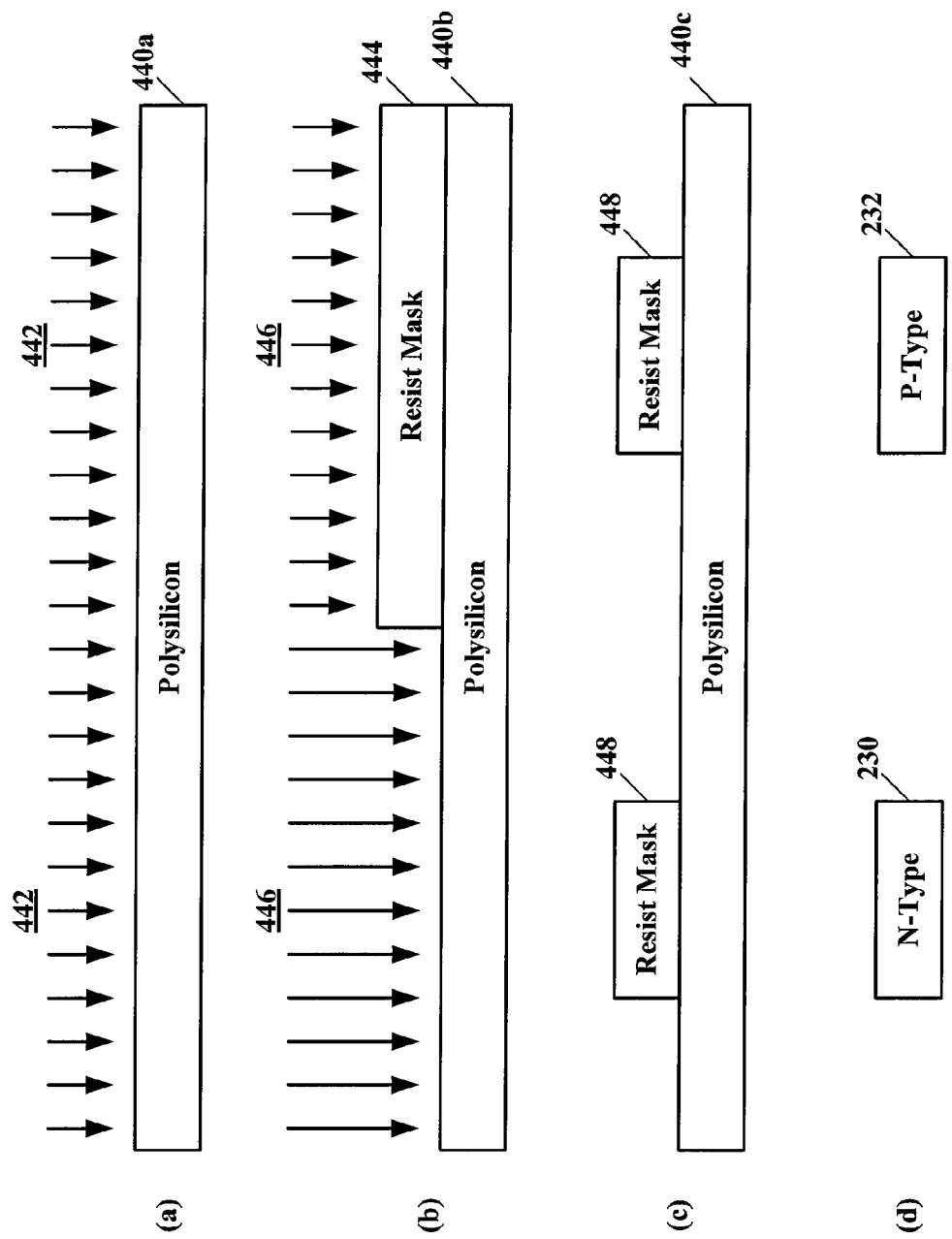
FIGS. 4(a)-(d) are schematic process diagrams of process steps used in fabricating N-type and P-type polysilicon gates for the pair of P-MOS transistors shown in FIGS. 1, 2 and 3, according to the specific example embodiments of this disclosure.

Referring to FIGS. 4(a)-(d), depicted are schematic process diagrams of process steps used in fabricating N-type and P-type polysilicon gates for the pair of P-MOS transistors shown in FIGS. 1, 2 and 3, according to the specific example embodiments of this disclosure. In FIG. 4(a) P− dopant 442 is implanted into a layer of polysilicon 440a. In FIG. 4(b) a resist mask 444 covers a portion of the P− dopant implanted polysilicon 440b, and then N+ dopant 446 is implanted in the portion of the polysilicon 440b that is not covered by the resist mask 444. In FIG. 4(c) the layer of P− dopant and N+ dopant implanted polysilicon 440c has mask pattern 448 placed over those portions of the multiply doped polysilicon 440c that are to retained, then the polysilicon 440c is etched away where not covered by the mask pattern 448. This leaves an isolated N-type polysilicon gate 230 and an isolated P-type polysilicon gate 232 as shown in FIG. 4(d). The P+ wells 220, 222 and 224 shown in FIGS. 2 and 3 are then created and self-aligned with the respective N-type polysilicon gate 230 and the respective P-type polysilicon gate 232 to produce the pair of P-MOS transistors 102 and 104, as described hereinabove. The aforementioned optional light P-type dopant may be implanted into the N-type well/region 234 before a gate oxide layer (e.g., thermally grown oxidation is used to create the gate oxides 226 and 228) and a polysilicon layer (e.g., polysilicon deposition is used to create the polysilicon gates oxides 230 and 232) are placed over the N-type well/region 234.

Figure 5:
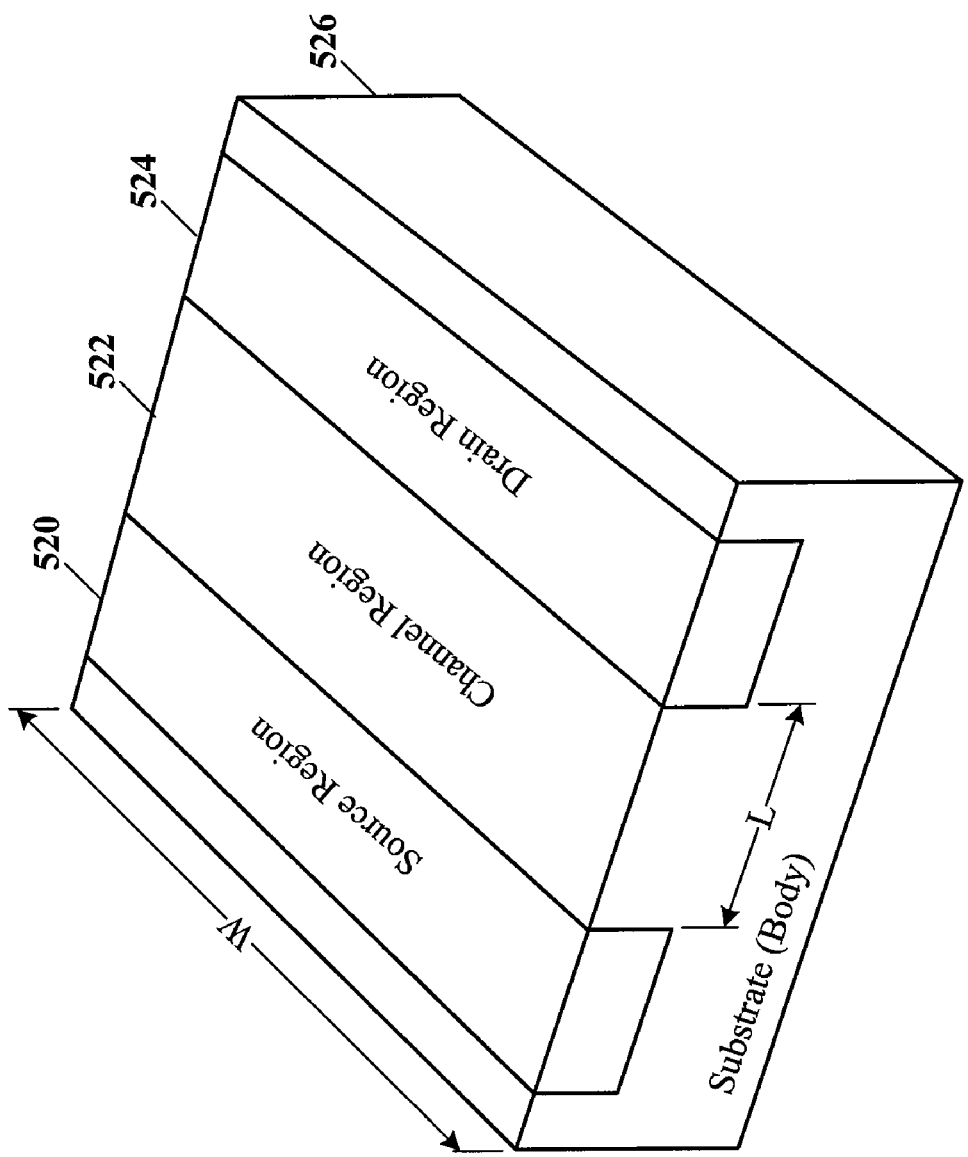
FIG. 5 is a schematic perspective view of a portion of a metal oxide semiconductor (MOS) transistor.

Referring to FIG. 5, depicted is a schematic perspective view of a portion of a metal oxide semiconductor (MOS) transistor. MOS transistors, e.g., P-MOS and N-MOS transistors, are comprised of structures, doped and otherwise, created in a semiconductor integrated circuit substrate 526. A source region 520, a channel region 522 and a drain region 524 become the source 222, gate depletion area under the gate oxide 226, and drain 220 (see FIGS. 2 and 3), respectively. The gain, β, of the MOS transistor is determined by the width, W, of the regions 520, 522 and 524, divided by the length, L, between the source region 520 and the drain region 524, i.e., β=W/L. Generally in fabricating MOS transistors on a semiconductor integrated circuit substrate, the length, L, remains about the same for all of the MOS transistors for a given fabrication process, wherein different gains of the MOS transistors are determined by changing the widths of the MOS transistors, i.e., the wider the regions 520, 522 and 524, the higher the MOS transistor gain, β.

By selectively sizing the widths of the regions 520, 522 and 524 (gains) of the P-MOS and/or N-MOS transistors comprising the operational amplifier 100, temperature compensation thereof may achieve a output voltage (reference voltage) having a stability of better then 50 parts per million (ppm), typically from about 20-30 ppm. For example, by making the regions of the P-MOS transistor 104 (P-type polysilicon gate 232) wider than the regions of the P-MOS transistor 102 (N-type polysilicon gate 230), e.g., about a 4:1 ratio, and making the regions of the N-MOS load transistor 108 wider than the regions of the N-MOS load transistor 106, e.g., about a 7:1 ratio, a sub 50 ppm temperature stability may be easily achieved. Other useful ranges may be from about a 2:1 ratio to about a 6:1 ratio for the P-MOS transistors 104 and 102, and from about a 4:1 ratio to about a 10:1 ratio for the N-MOS load transistors 108 and 106. Computer simulations of the operational amplifier circuit 100 may also be used to provide further useful combinations of MOS transistor gains for optimal temperature stability based upon any given semiconductor transistor fabrication process.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A temperature compensated voltage reference fabricated on an integrated circuit die, comprising:
 a first P-channel metal oxide semiconductor (P-MOS) transistor having an N-type polysilicon gate, wherein the N-type polysilicon gate causes the first P-MOS transistor to have a first threshold voltage;
 the first P-MOS transistor having a first width;
 a second P-MOS transistor having a P-type polysilicon gate, wherein the P-type polysilicon gate causes the second P-MOS transistor to have a second threshold voltage;
 the second P-MOS transistor having a second width, wherein the first and second widths are selected for optimal temperature compensation;
 the first and second P-MOS transistors are configured as a differential pair of an operational amplifier; and
 the operational amplifier has an output voltage substantially equal to a difference between the first and the second threshold voltages, wherein the first and second widths of the first and second P-MOS transistors are selected to compensate for a variation in the output voltage over a temperature range.

2. The temperature compensated voltage reference according to claim 1, further comprising:

a third N-channel metal oxide semiconductor (N-MOS) load transistor having a third width, the third N-MOS load transistor is coupled to the first P-MOS transistor; and a fourth N-MOS load transistor having a fourth width, the fourth N-MOS load transistor is coupled to the second P-MOS transistor;

wherein the third and fourth widths of the third and fourth N-MOS load transistors are selected to further compensate for the variation in the output voltage over the temperature range.

3. The temperature compensated voltage reference according to claim 1, wherein the second width is from about two to about six times the first width.

4. The temperature compensated voltage reference according to claim 1, wherein the second width is about four times the first width.

5. The temperature compensated voltage reference according to claim 2, wherein the third width is from about four to about ten times the fourth width.

6. The temperature compensated voltage reference according to claim 2, wherein the third width is about seven times the fourth width.

7. The temperature compensated voltage reference according to claim 1, wherein the first threshold voltage is about a minus 1.4 volts.

8. The temperature compensated voltage reference according to claim 7, wherein the second threshold voltage is about a minus 0.3 volts.

9. The temperature compensated voltage reference according to claim 8, wherein the output voltage of the operational amplifier is about 1.1 volts.

10. The temperature compensated voltage reference according to claim 1, further comprising a lightly doped P-type implant in an N-type substrate of the integrated circuit die where gate channels of the first and second P-MOS transistors are located.

11. The temperature compensated voltage reference according to claim 10, wherein the first threshold voltage is about a minus 1.1 volts.

12. The temperature compensated voltage reference according to claim 11, wherein the second threshold voltage is about 0.0 volts.

13. The temperature compensated voltage reference according to claim 12, wherein the output voltage of the operational amplifier is about 1.1 volts.

14. A method of fabricating a temperature compensated voltage reference on an integrated circuit die, said method comprising the steps of:

providing an N-type well/region in a silicon semiconductor integrated circuit die;

creating a first transistor having a first width in the silicon semiconductor integrated circuit die for a first P-channel metal oxide semiconductor (P-MOS) transistor;

creating a second transistor having a second width in the silicon semiconductor integrated circuit die for a second P-MOS transistor;

covering at least a portion of the N-type substrate with an oxide layer in an area used to form first and second gates of the first and second P-MOS transistors, respectively, for an operational amplifier;

covering the oxide layer with a polysilicon layer;

implanting a $P^-$ dopant into the polysilicon layer;

covering a portion of the $P^-$ doped polysilicon layer with a first resist mask over where the second P-MOS transistor is located;

implanting an $N^+$ dopant into the $P^-$ doped polysilicon layer wherever the first resist mask does not cover the $P^-$ doped polysilicon layer;

removing the first resist mask;

covering a portion of the $N^+$ doped polysilicon layer and a portion of the $P^-$ doped polysilicon layer with a second resist mask; and removing the $N^+$ doped polysilicon layer where not covered by the second resist mask to form an N-type polysilicon gate for the first P-MOS transistor, the $P^-$ doped polysilicon layer where not covered by the second resist mask to form a P-type polysilicon gate for the second P-MOS transistor, and the oxide layer where not covered by the second resist mask, wherein the first and second P-MOS transistors have different threshold voltages, and the first and second widths of the first and second P-MOS transistors are selected to compensate for threshold voltage variations of the first and second P-MOS transistors over a temperature range.

15. The method according to claim 14, further comprising the steps of:

creating in the silicon semiconductor integrated circuit die a third N-channel metal oxide semiconductor (N-MOS) load transistor having a third width, the third N-MOS load transistor is coupled to the first P-MOS transistor; and creating in the silicon semiconductor integrated circuit die a fourth N-MOS load transistor having a fourth width, the fourth N-MOS load transistor is coupled to the second P-MOS transistor;

wherein the third and fourth widths of the third and fourth N-MOS load transistors are selected to further compensate for the threshold voltage variations of the first and second P-MOS transistors over the temperature range.

16. The method according to claim 14, wherein the second width is from about two to about six times the first width.

17. The method according to claim 14, wherein the second width is about four times the first width.

18. The method according to claim 15, wherein the third width is from about four to about ten times the fourth width.

19. The method according to claim 15, wherein the third width is about seven times the fourth width.

20. The method according to claim 14, further comprising the step of covering the N-type and P-type polysilicon gates, and the $P^+$ well sources and drains with a protective oxide layer.

21. The method according to claim 14, further comprising the step of configuring the first and second P-MOS transistors as a differential pair of an operational amplifier.

22. The method according to claim 14, further comprising the step of implanting a light P-type implant into the N-type substrate before performing the step of covering at least a portion of the N-type substrate with an oxide layer.

23. The method according to claim 22, wherein the light P-type implant is boron.

* * * * *